(12) United States Patent
Tezuka

(10) Patent No.: US 11,087,813 B2
(45) Date of Patent: Aug. 10, 2021

(54) CONTROL CIRCUIT, SEMICONDUCTOR MEMORY DEVICE, INFORMATION PROCESSING DEVICE, AND CONTROL METHOD

(71) Applicant: Sony Semiconductor Solutions Corporation, Kanagawa (JP)

(72) Inventor: Hiroyuki Tezuka, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 94 days.

(21) Appl. No.: 16/491,935

(22) PCT Filed: Feb. 14, 2018

(86) PCT No.: PCT/JP2018/005047
§ 371 (c)(1),
(2) Date: Sep. 6, 2019

(87) PCT Pub. No.: WO2018/163731
PCT Pub. Date: Sep. 13, 2018

(65) Prior Publication Data
US 2021/0134338 A1 May 6, 2021

(30) Foreign Application Priority Data
Mar. 9, 2017 (JP) .............................. JP2017-044961

(51) Int. Cl.
*G11C 11/00* (2006.01)
*G11C 11/16* (2006.01)
*H01L 27/22* (2006.01)

(52) U.S. Cl.
CPC ...... *G11C 11/1673* (2013.01); *G11C 11/1659* (2013.01); *G11C 11/1675* (2013.01); *H01L 27/228* (2013.01)

(58) Field of Classification Search
CPC ............ G11C 11/1673; G11C 11/1659; G11C 11/1675
See application file for complete search history.

(56) References Cited

U.S. PATENT DOCUMENTS 7,733,729 B2 * 6/2010 Boeve .................... G11C 11/16
365/210.1
8,923,032 B2 * 12/2014 Shimakawa ....... G11C 13/0007
365/148

(Continued)

FOREIGN PATENT DOCUMENTS

JP 2009-140576 A 6/2009
JP 2017-021877 A 1/2017

(Continued)

OTHER PUBLICATIONS

International Search Report and Written Opinion issued in connection with International Patent Application No. PCT/JP2018/005047 dated Mar. 27, 2018. (7 pages).

*Primary Examiner* — Pho M Luu
(74) *Attorney, Agent, or Firm* — K&L Gates LLP

(57) ABSTRACT

A control circuit capable of generating a reliable reference potential while suppressing increase in power consumption and cost. A control circuit causes write processing to be performed individually for a first reference element set to a first resistance state in generating a reference potential used for reading data from a memory element, and a second reference element different from the first reference element, the second reference element being set to a second resistance state different from the first resistance state in generating the reference potential.

13 Claims, 18 Drawing Sheets

(56) References Cited

U.S. PATENT DOCUMENTS 9,570,166 B1 * 2/2017 Gilbert .............. G11C 11/5614
9,892,773 B2 * 2/2018 Antonyan ........... G11C 11/1655

FOREIGN PATENT DOCUMENTS

| WO | 2009/073221 A1 | 6/2009 |
| WO | 2017/010147 A1 | 1/2017 |

* cited by examiner

FIG. 8

| NUMBER OF TIMES OF WR | RH | RL |
|---|---|---|
| FIRST TIME | — | RREF |
| ... | — | RREF |
| 256TH TIME | — | RREF |
| ... | — | RREF |

FIG. 11

| NUMBER OF TIMES OF WR | RH0 | RH1 | RL0 | RL1 |
|---|---|---|---|---|
| FIRST TIME | — | — | RREF | RREF |
| ... | — | — | RREF | RREF |
| 256TH TIME | RREF | RREF | RREF | RREF |
| ... | — | — | RREF | RREF |

FIG. 12

| NUMBER OF TIMES OF WR | RH0 | RH1 | RL0 | RL1 |
|---|---|---|---|---|
| FIRST TIME | — | — | RREF | RREF |
| ... | — | — | RREF | RREF |
| 256TH TIME | RREF | RREF | — | — |
| ... | — | — | RREF | RREF |

FIG. 13

| NUMBER OF TIMES OF WR | RH0 | RH1 | RL0 | RL1 |
|---|---|---|---|---|
| FIRST TIME | — | — | RREF | — |
| SECOND TIME | — | — | — | RREF |
| ... | — | — | RREF ALTERNATELY | |
| 256TH TIME | RREF | — | — | — |
| 257TH TIME | — | RREF | — | — |
| ... | — | — | RREF ALTERNATELY | |

FIG. 14

| NUMBER OF TIMES OF WR | RH | RL |
|---|---|---|
| FIRST TIME | — | RREF |
| ... | — | — |
| FOURTH TIME | — | RREF |
| ... | — | — |

FIG. 16

| NUMBER OF TIMES OF WR | RH | RL |
|---|---|---|
| FIRST TIME | — | RREF |
| ... | — | — |
| 256TH TIME | — | RREF |
| ... | — | — |
| 384TH TIME | — | RREF |
| ... | — | — |

} LOW TEMPERATURE STATE

} HIGH TEMPERATURE STATE

CONTROL CIRCUIT, SEMICONDUCTOR MEMORY DEVICE, INFORMATION PROCESSING DEVICE, AND CONTROL METHOD

TECHNICAL FIELD

The present disclosure relates to a control circuit, a semiconductor memory device, an information processing device, and a control method.

BACKGROUND ART

As a method of generating a reference potential of a sense amplifier in a spin transfer torque magnetoresistive random access memory (STT-MRAM), known is a method of providing a reference cell in which a plurality of memory cells is connected in parallel and in series, and using the reference cell as a reference resistor at the time of reference potential generation. Furthermore, there is also a technology of, in order to set a combined resistance value of a reference cell to a desired value between high resistance (RH) and low resistance (RL), mounting a plurality of RH and RL cells, and making the ratio of each cell variable (Patent Documents 1 and 2 and the like).

In a memory device using a magnetic tunnel junction (MTJ) element, it is known that information stored in the MTJ element may be unintentionally inverted. Therefore, periodic refresh operation (rewrite operation) is required for reliable reading. For example, Patent Document 3 discloses a technology for performing refresh operation on a reference cell in parallel with a write operation to a memory cell.

CITATION LIST

Patent Document

Patent Document 1: Japanese Patent Application Laid-Open No. 2009-187631
Patent Document 2: Japanese Patent Application Laid-Open No. 2013-4151
Patent Document 3: PCT Japanese Translation Patent Publication No. 2013-524392

SUMMARY OF THE INVENTION

Problems to be Solved by the Invention

However, performing refresh operation on a reference cell in parallel with write operation to a memory cell not only increases the power consumption but also leads to an increase in chip cost due to the increase in peak current.

Thus, the present disclosure proposes a novel and improved control circuit, a semiconductor memory device, an information processing device, and a control method that can reliably generate a reference potential while suppressing an increase in power consumption and an increase in cost.

Solutions to Problems

According to the present disclosure, there is provided a control circuit that causes write processing to be performed individually for a first reference element set to a first resistance state in generating a reference potential used for reading data from a memory element, and a second reference element different from the first reference element, the second reference element being set to a second resistance state different from the first resistance state in generating the reference potential.

Furthermore, according to the present disclosure, there is provided a semiconductor memory device including: a memory element; a first reference element set to a first resistance state in generating a reference potential used for reading data from the memory element; a second reference element different from the first reference element, the second reference element being set to a second resistance state different from the first resistance state in generating the reference potential; and a control circuit that performs write processing individually for the first reference element and the second reference element.

Furthermore, according to the present disclosure, there is provided an information processing device including at least one above-described semiconductor memory device.

Furthermore, according to the present disclosure, there is provided a control method of performing, by a processor, write processing individually for a first reference element set to a first resistance state in generating a reference potential used for reading data from a memory element, and a second reference element different from the first reference element, the second reference element being set to a second resistance state different from the first resistance state in generating the reference potential.

Effects of the Invention

As described above, the present disclosure can provide a novel and improved control circuit, a semiconductor memory device, an information processing device, and a control method that can reliably generate a reference potential while suppressing an increase in power consumption and an increase in cost.

Note that the effect described above is not necessarily limitative, and any of the effects shown in the present specification or other effects that can be understood from the present specification may be exhibited together with the effect described above, or instead of the effect described above.

BRIEF DESCRIPTION OF DRAWINGS

FIG. 8 is an explanatory table showing an example of output of a refresh enable signal by a control circuit 100.

FIG. 11 is an explanatory table showing an example of output of a refresh enable signal by the control circuit 100.

FIG. 12 is an explanatory table showing an example of output of a refresh enable signal by the control circuit 100.

FIG. 13 is an explanatory table showing an example of output of a refresh enable signal by the control circuit 100.

FIG. 14 is an explanatory table showing an example of output of a refresh enable signal by the control circuit 100.

FIG. 16 is an explanatory table showing an example of output of a refresh enable signal by the control circuit 100.

MODE FOR CARRYING OUT THE INVENTION

Figure 1:
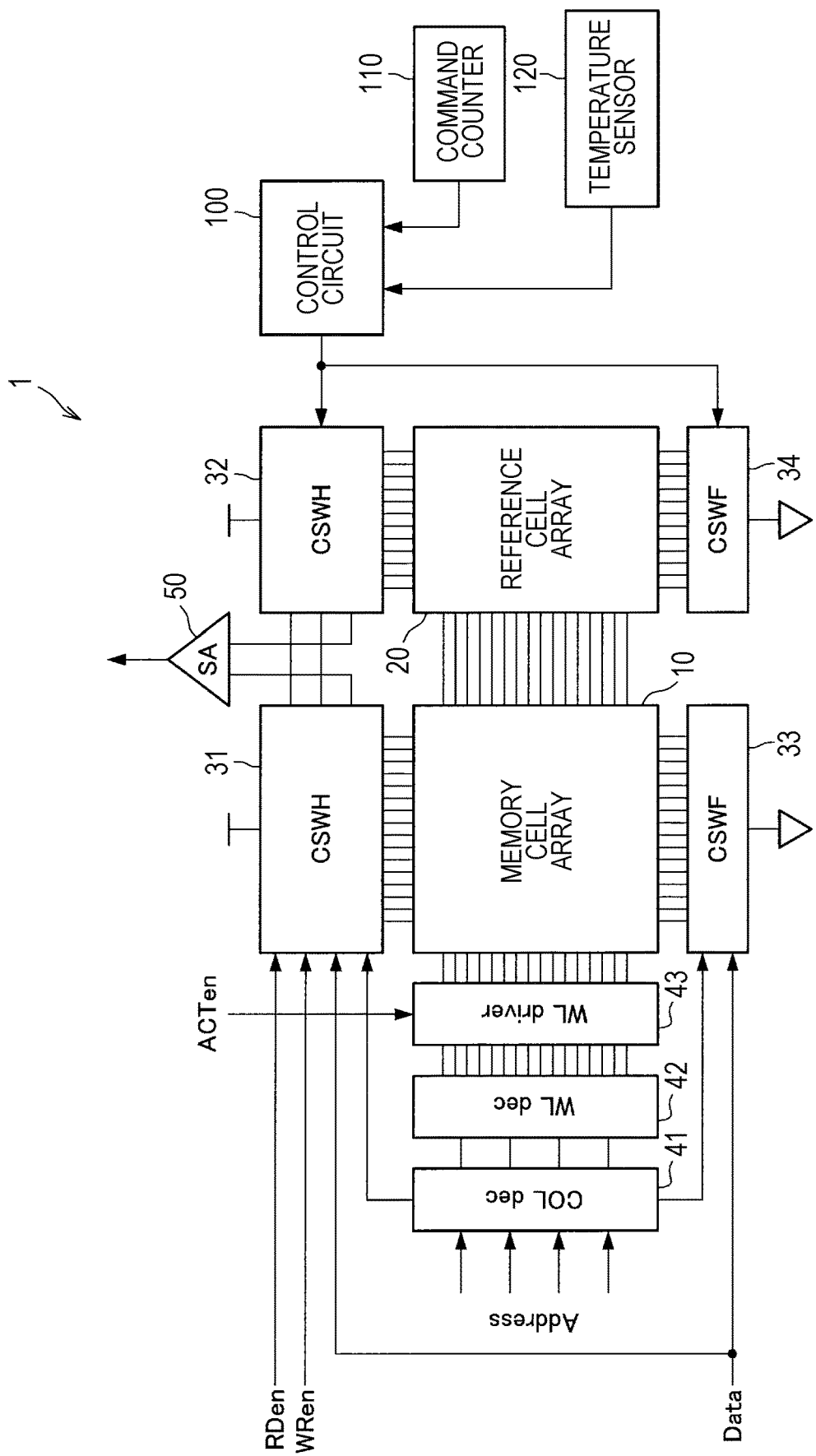
FIG. 1 is an explanatory diagram showing an example of a functional configuration of a semiconductor memory device according to an embodiment of the present disclosure.

Preferred embodiments of the present disclosure will be described in detail below with reference to the accompanying drawings. Note that, in the present specification and the drawings, the same reference numerals are given to the constituent elements having substantially the same functional configuration, and redundant explanations are omitted.

Note that the description will be given in the following order.
1. Embodiment of Present Disclosure
1.1. Overview
1.2. Configuration Example
2. Application Example
3. Conclusion 1. Embodiment of Present Disclosure

[1.1. Overview]

Before describing the embodiments of the present disclosure in detail, an overview of the embodiments of the present disclosure will be described.

A magnetic tunnel junction (MTJ) element, which is a variable resistance nonvolatile element, is an element having two magnetic layers and a nonmagnetic layer provided between the magnetic layers. In the MTJ element, a resistance value between the two magnetic layers is in either a low resistance state or a high resistance state depending on whether or not magnetization directions of the two magnetic layers are parallel. The variable resistance element can hold the resistance state in a non-volatile manner.

As described above, as a method of generating a reference potential of a sense amplifier in a spin transfer torque magnetic random access memory (STT-MRAM) using the MTJ element as a memory element, known is a method of providing a reference cell in which a plurality of memory cells is connected in parallel and in series, and using the reference cell as a reference resistor at the time of reference potential generation. Furthermore, there is also a technology of, in order to set a combined resistance value of reference cells to a desired value between high resistance (RH) and low resistance (RL), mounting a plurality of RH and RL cells, and making the ratio of each cell variable.

In a memory device using an MTJ element, information stored in the MTJ element may be unintentionally inverted by the following mechanism. Therefore, periodic refresh operation (rewrite operation) is required for reliable reading. In particular, unintended logic inversion is not allowed since a reference cell is accessed each time it is read and used as a reference for H/L determination of stored data.

Among the mechanisms that cause unintended logic inversion, a fatal one is a read disturb. This is a logic inversion which occurs with a certain probability even if a minute current applied at the time of reading is equal to or less than a write threshold, and is a phenomenon which cannot be ignored particularly in a reference cell accessed each time it is read. In order to prevent a read error due to this logic inversion, it is generally necessary to perform write operation (refresh writing) for overwriting desired data also on a reference cell behind writing to a memory cell (in parallel with writing).

The following two points can be mentioned as the reasons for refreshing a reference cell in parallel with writing to a memory cell. The first point is that since the STT-MRAM aims at a non-volatile memory, it is not desired to make a user be aware of refresh operation. The second point is that even in a case of refreshing of a reference cell, a write pulse length equal to that of a normal cell is required, and in a case where a read command is issued during reference cell refresh at a timing other than writing, the reference cell refresh may be incomplete.

By the way, proposals have also been made to suppress the occurrence of the above-mentioned logic inversion. For example, Patent Document 2 listed above proposes an arrangement of the configuration of a reference cell in which a read disturb is unlikely to occur. However, what has been proposed is limited to the configuration of a specific reference cell, and cannot be applied to an arbitrary combination of reference cells. In order to achieve a more efficient and higher-quality readout circuit, a reference cell with a configuration different from that proposed in Patent Document 2 may be assumed, so that it is necessary to consider a circuit and a control method on the basis of an arbitrary configuration.

On the other hand, one of the disadvantages in refreshing a reference cell in parallel with writing to a memory cell is an increase in current consumption. In the current writing type STT-MRAM, the power at the time of writing is inherently high, and an increase in the number of cells to be written leads to an increase in peak current. An increase in peak current directly leads to an increase in chip resources such as a write circuit and a wiring area, which also leads to an increase in chip cost. Furthermore, when the power consumption increases, the consumption of the battery increases in the mobile product, leading to a decrease in the operation time, which may greatly damage the product value. Furthermore, an increase in heat generation leads to a decrease in product performance and a deterioration in product life, and causes a further increase in cost such as the need for measures and members to prevent them.

In view of the above, when considering the practical application of the STT-MRAM and the improvement of its value, it is considered that the suppression of power consumption is highly important, and the reduction of operating power is strongly demanded. On the other hand, in order to maintain the function as a memory, it is also necessary to reliably prevent the aforementioned logic inversion. Accordingly, the above points need to be cleared simultaneously.

Therefore, in view of the above-mentioned point, the present disclosure person has diligently studied about a technology for achieving both reliable prevention of logic inversion of a reference cell and suppression of power consumption. As a result, the present disclosure person came to devise a technology for achieving both reliable prevention of logic inversion of a reference cell and suppression of power consumption, as described below.

1.2. Configuration Example

Subsequently, an embodiment of the present disclosure will be described in detail. FIG. 1 is an explanatory diagram showing an example of a functional configuration of a semiconductor memory device according to an embodiment of the present disclosure. An example of a functional configuration of the semiconductor memory device according to the embodiment of the present disclosure will be described below with reference to FIG. 1.

As shown in FIG. 1, a semiconductor memory device 1 according to the embodiment of the present disclosure includes a memory cell array 10, a reference cell array 20, column control switches 31 and 32 on a VDD side, column control switches 33 and 34 on a VSS side, a column decoder 41, a word line decoder 42, a word line driver 43, a sense amplifier 50, a control circuit 100, a command counter 110, and a temperature sensor 120.

The memory cell array 10 includes memory cells having memory elements arranged in a matrix. In the present embodiment, as the memory element, an element is used which utilizes the fact that the resistance state changes reversibly in accordance with the polarity of the potential difference applied between both ends to store information. As such an element, an MTJ element can be used as described above. The memory element has two distinguishable resistance states (a low resistance state and a high resistance state). Furthermore, the memory cell array 10 also has a plurality of word lines extending in a row direction (horizontal direction), and a plurality of bit lines and a plurality of source lines extending in a column direction (vertical direction). One end of each word line is connected to the word line driver 43, and each bit line is connected to the column control switch 31 on the VDD side and the column control switch 33 on the VSS side.

The reference cell array 20 has a plurality of reference cells arranged in a matrix. Furthermore, as similar to the memory cell array 10, the reference cell array 20 has a plurality of word lines extending in a row direction (horizontal direction), and a plurality of bit lines and a plurality of source lines extending in a column direction (vertical direction). One end of each word line is connected to the word line driver 43, and each bit line is connected to the column control switch 32 on the VDD side and the column control switch 34 on the VSS side.

In the present embodiment, the reference cells provided in the reference cell array 20 have a high resistance reference cell and a low resistance reference cell. With the high resistance reference cell and the low resistance reference cell, the combined resistance value of the reference cells is made to be a desired value between high resistance and low resistance.

The column control switches 31 to 34 connect a bit line and a source line related to a memory cell to be driven among a plurality of bit lines and source lines of the memory cell array 10 to a bit line drive unit and a source line drive unit not shown on the basis of control signals. The control signals supplied to the column control switches 31 to 34 include a read enable signal RDen and a write enable signal WRen. Furthermore, a data signal Data and a signal from the column decoder 41 (a decoded column address signal) are sent to the column control switches 31 to 34.

The column decoder 41 decodes the address signal and sends the decoded signal to the column control switches 31 to 34. The word line decoder 42 decodes the address signal and sends the decoded signal to the word line driver 43. The word line driver 43 selects a memory cell to be driven in the memory cell array 10 on the basis of a control signal. Specifically, the word line driver 43 applies a signal to the word line of the memory cell array 10 to select the row to which the memory cell to be subjected to the data write or read operation belongs. In addition to the signal from the word line decoder 42, a signal ACTen for activating the word line is sent to the word line driver 43.

When reading data from the memory cell of the memory cell array 10, the sense amplifier 50 compares the potential output through the bit line with the reference potential generated by the reference cell of the reference cell array 20, and outputs data indicating whether the potential is higher (H) or lower (L) than the reference potential.

Figure 2:
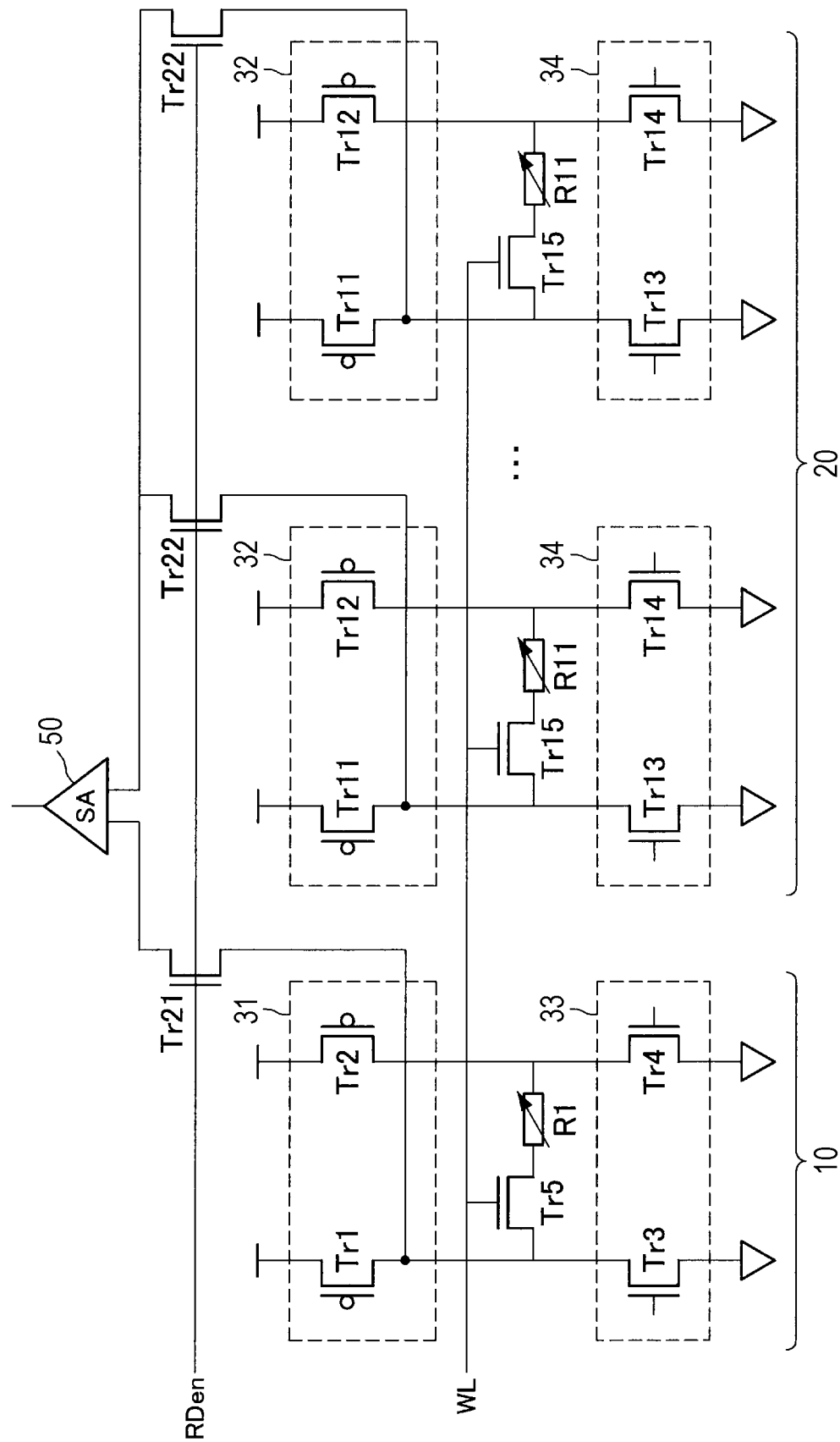
FIG. 2 is an explanatory diagram showing an example of a circuit configuration of a memory cell array 10, a reference cell array 20, and their periphery.

Here, an example of a circuit configuration of the memory cell array 10, the reference cell array 20, and their periphery are shown. FIG. 2 is an explanatory diagram showing an example of a circuit configuration of the memory cell array 10, the reference cell array 20, and their periphery.

The column control switch 31 includes MOS transistors Tr1 and Tr2. The column control switch 32 includes MOS transistors Tr11 and Tr12. The column control switch 33 includes MOS transistors Tr3 and Tr4. The column control switch 32 includes MOS transistors Tr13 and Tr14. Furthermore, a MOS transistor Tr21 is provided between the column control switch 31 and the sense amplifier 50, and a MOS transistor Tr22 is provided between the column control switch 32 and the sense amplifier 50. The MOS transistors Tr21 and Tr22 are switched on and off by the read enable signal RDen.

The memory cell array 10 has a configuration in which memory cells having a selection transistor Tr5 and a memory element R1 are arranged on a matrix. Note that, in FIG. 2, in order to simplify the description, the memory cell array 10 is shown in which only one memory cell is provided.

The reference cell array 20 has a configuration in which reference cells having a selection transistor Tr15 and a memory element R11 are arranged on a matrix. Note that, in FIG. 2, in order to simplify the description, the reference cell array 20 is shown in which only two reference cells are provided.

Figure 3:
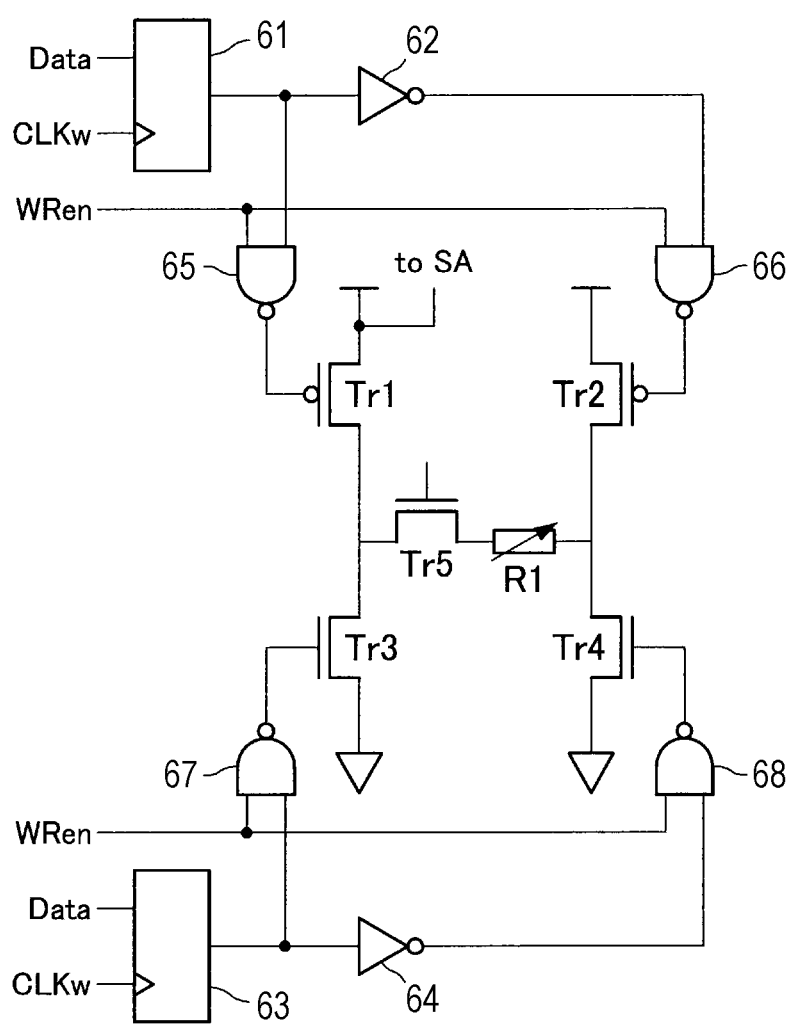
FIG. 3 is an explanatory diagram showing an example of a circuit configuration of the memory cell array 10 and a periphery of the memory cell array 10.

FIG. 3 is an explanatory diagram showing an example of a circuit configuration of the memory cell array 10 and a periphery of the memory cell array 10. The peripheral circuits of the memory cell array 10 shown in FIG. 3 are circuits for performing write operation on a memory cell. FIG. 3 shows registers 61 and 63, NOT gates 62 and 64, NAND gates 65 to 68, the transistors Tr1 to Tr5, and the memory element R1. In the memory cell array 10, when one of the transistors Tr1 and Tr2 is turned on and one of the transistors Tr3 and Tr4 is turned on by the NOT gates 62 and 64, writing of data to the memory element R1 can be performed, in other words, the resistance state of the memory element R1 can be changed.

Figure 4:
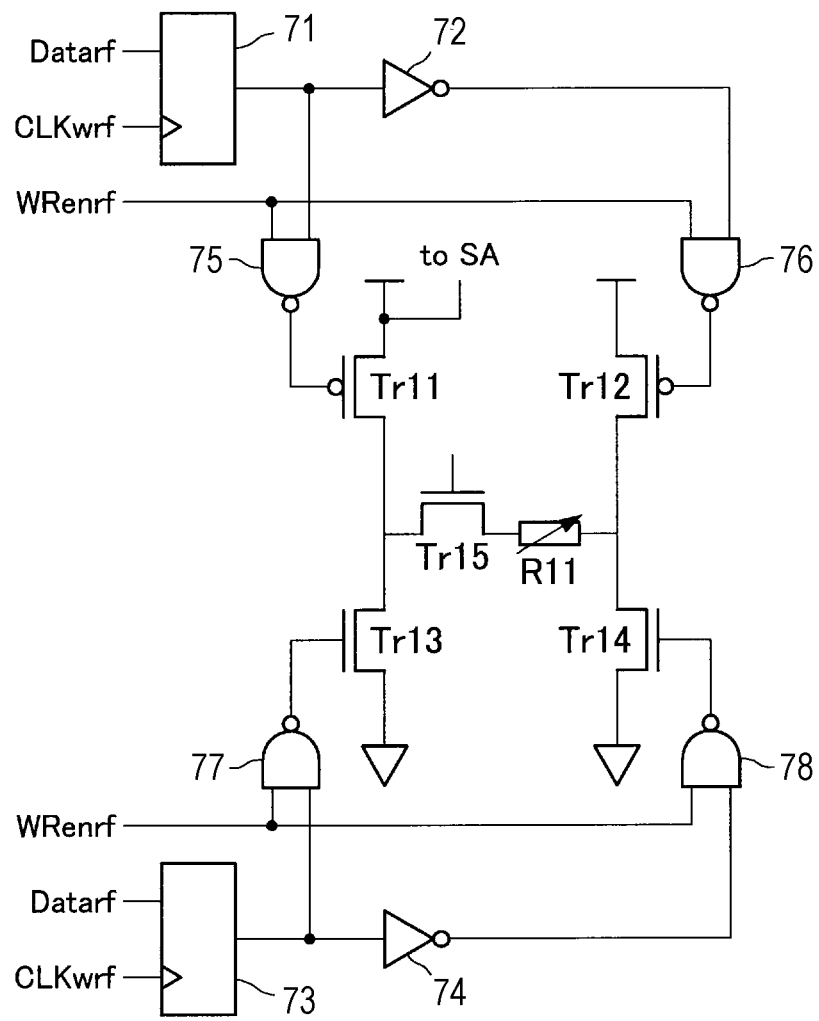
FIG. 4 is an explanatory diagram showing an example of a circuit configuration of the reference cell array 20 and a periphery of the reference cell array 20.
Figure 5:
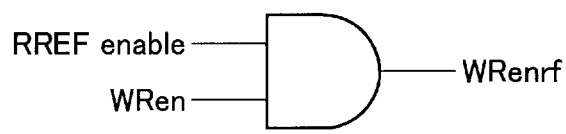
FIG. 5 is an explanatory diagram showing an AND gate.

FIG. 4 is an explanatory diagram showing an example of a circuit configuration of the reference cell array 20 and a periphery of the reference cell array 20. The circuit in the periphery of the reference cell array 20 shown in FIG. 4 is a circuit for performing write operation on the reference cell. FIG. 4 shows registers 71 and 73, NOT gates 72 and 74, NAND gates 75 to 78, the transistors Tr11 to Tr15, and the memory element R11. Furthermore, FIG. 5 is an explanatory diagram showing an AND gate, and is an explanatory diagram showing an AND gate 79 that generates a write enable signal WRenrf to the reference cell from a refresh enable signal RREF enable and a write enable signal WRen. In other words, the write enable signal WRenrf becomes 1 only in a case where both the refresh enable signal RREF enable and the write enable signal WRen become 1. In the reference cell array 20, when one of the transistors Tr11 and Tr12 is turned on and one of the transistors Tr13 and Tr14 is turned on by the NOT gates 72 and 74, writing of data to the memory element R11 can be performed, in other words, the resistance state of the memory element R11 can be changed.

The control circuit 100 is a circuit that controls the refresh operation for the reference cell array 20. In the present embodiment, as described below, the refresh operation is changed between the high resistance reference cell and the low resistance reference cell. More specifically, the control circuit 100 operates to perform the refresh operation with respect to the reference cell in which the read disturb easily occurs more frequently than the reference cell in which the read disturb does not easily occur. In other words, the control circuit 100 independently outputs a refresh enable signal for performing refresh operation on a high resistance reference cell and a refresh enable signal for performing refresh operation on a low resistance reference cell.

The command counter 110 counts the number of times the write command and the read command have been issued, and outputs the counted value to the control circuit 100. The control circuit 100 performs refresh operation on the reference cell array 20 on the basis of the value counted by the command counter 110.

The temperature sensor 120 senses the temperature in the periphery of the memory cell array 10 and the reference cell array 20, and outputs the sensing result to the control circuit 100. The control circuit 100 performs refresh operation on the reference cell array 20 on the basis of the sensing result of the temperature sensor 120. For example, the control circuit 100 may change the pattern of the refresh operation on the reference cell array 20 depending on whether the temperature sensed by the temperature sensor 120 is equal to or higher than a predetermined threshold or less than the threshold.

Figure 6:
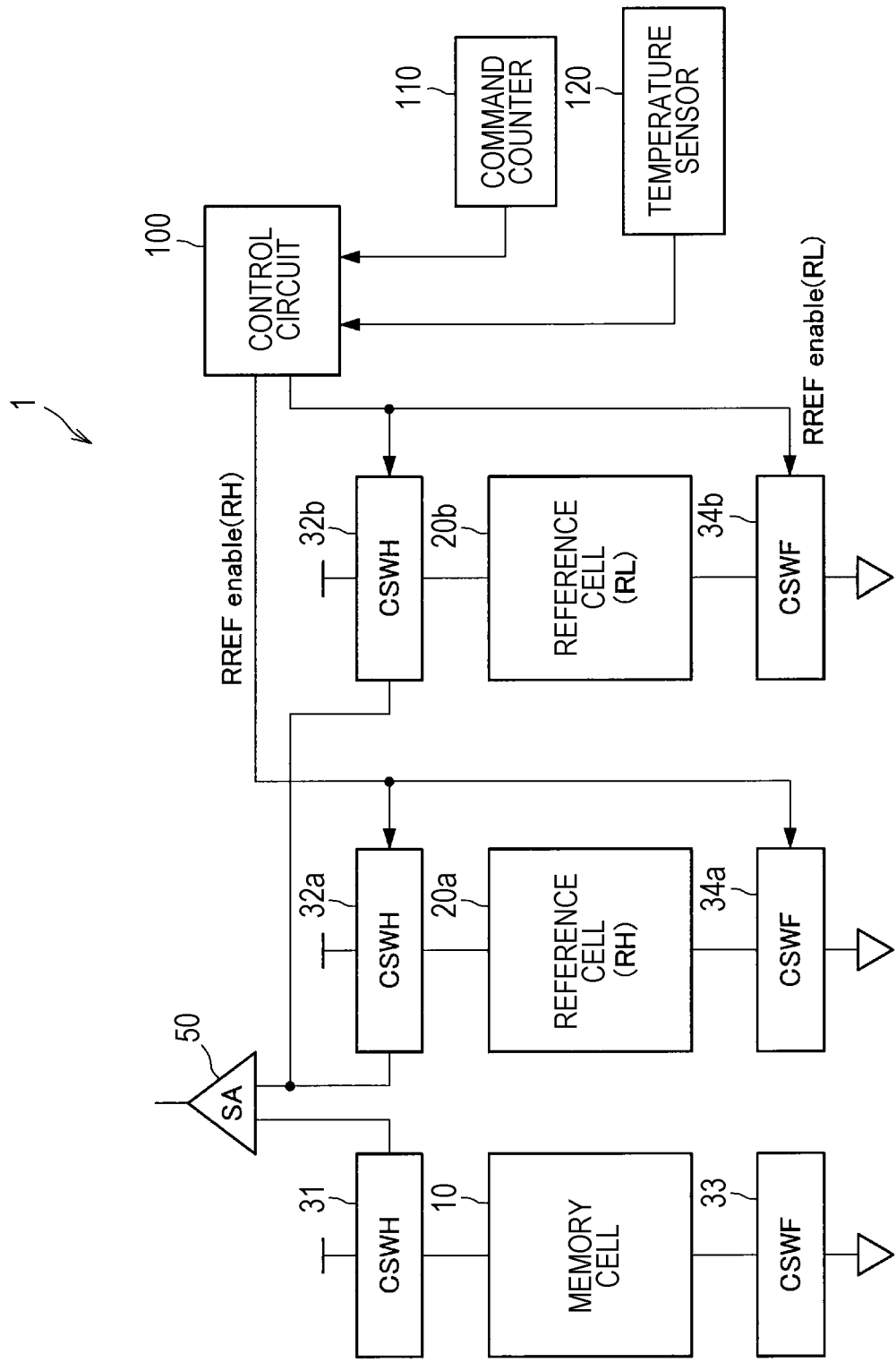
FIG. 6 is an explanatory diagram showing an example of a functional configuration of a semiconductor memory device 1 according to the same embodiment.
Figure 7:
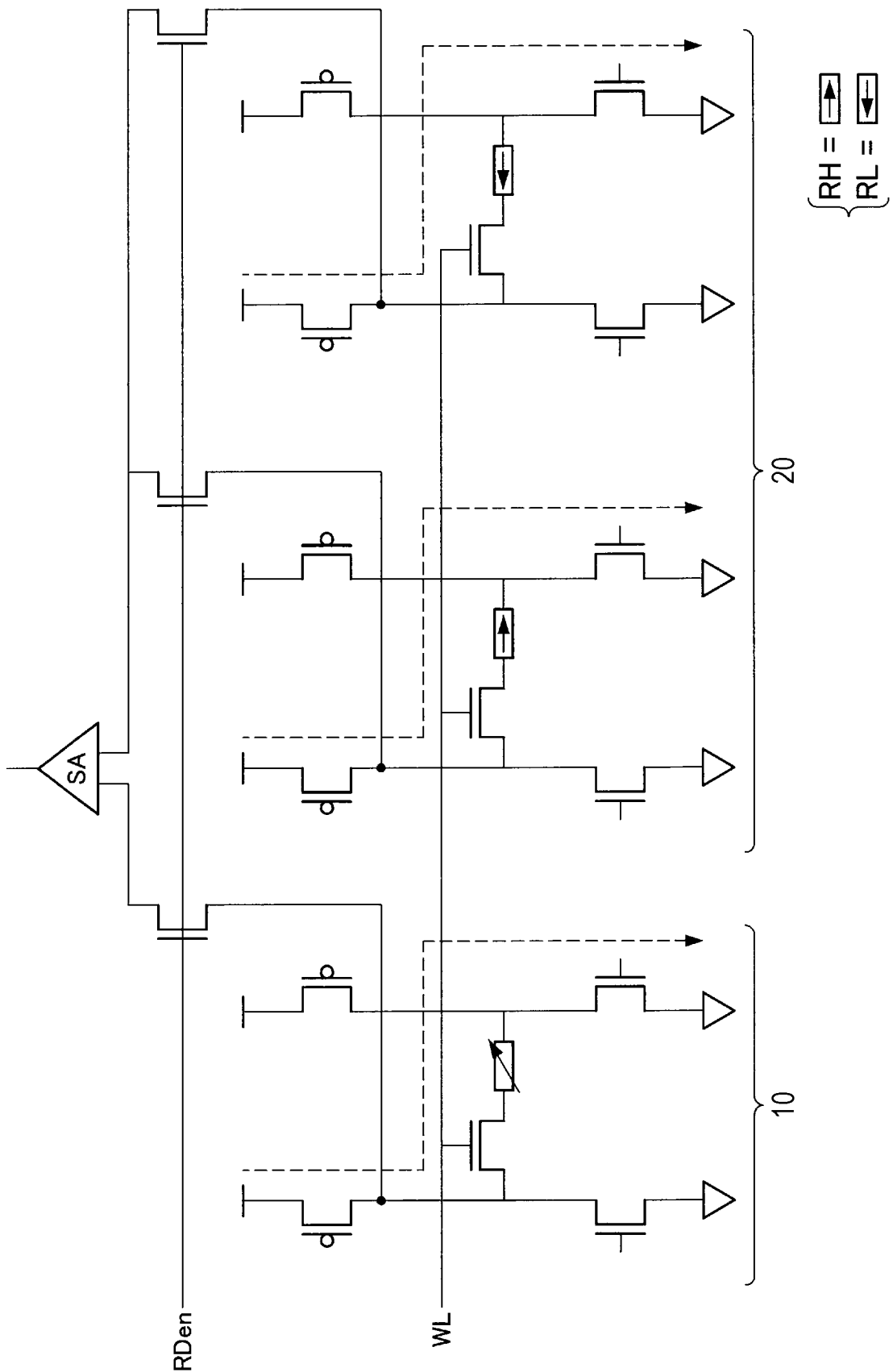
FIG. 7 is an explanatory diagram showing an example of a circuit configuration of the memory cell and the reference cell shown in FIG. 6.

FIG. 6 is an explanatory diagram showing an example of a functional configuration of the semiconductor memory device 1 according to the present embodiment, and shows an example of a functional configuration of the semiconductor memory device 1 for changing the refresh operation between a high resistance reference cell and a low resistance reference cell. Furthermore, FIG. 7 is an explanatory diagram showing an example of a circuit configuration of the memory cell and the reference cell shown in FIG. 6, and shows an example in the case of generating a reference potential by a high resistance reference cell and a low resistance reference cell.

FIG. 6 shows a configuration in which a normal memory cell is connected to one side of the sense amplifier 50, and one high resistance (RH) reference cell and one low resistance (RL) reference cell are connected in parallel as reference cells on the other side. Of course, the number of sets of the high resistance reference cell and the low resistance reference cell is not limited to one, and an example in which there are a plurality of such sets will be described later.

The source line of the reference cell is connected to the sense amplifier 50 via a switch (MOS transistor) on both the high resistance side and the low resistance side. The control circuit 100 is configured to output a refresh enable signal to the high resistance reference cell and the low resistance reference cell. Furthermore, in the configuration in the present embodiment, the read disturb occurs only in the low resistance reference cell. Accordingly, the control circuit 100 operates to perform the refresh operation with respect to the low resistance reference cell more frequently than the high resistance reference cell. FIG. 6 shows column control switches 32a and 34a for the high resistance reference cell and column control switches 32b and 34b for the low resistance reference cell.

For example, the control circuit 100 may output the refresh enable signal only to the low resistance reference cell in synchronization with the timing of the write operation to the normal memory cell. FIG. 8 is an explanatory table showing an example of the output of the refresh enable signal to the high resistance reference cell and the low resistance reference cell shown in FIGS. 6 and 7 by the control circuit 100. As described above, the refresh enable signal is not output to the high resistance reference cell, and the refresh enable signal is output to the low resistance reference cell in synchronization with the timing of the write operation to the normal memory cell. As described above, the semiconductor memory device 1 according to the present embodiment can achieve both reliably preventing the logic inversion of the reference cell, and suppressing the power consumption by the control circuit 100 outputting the refresh enable signal only to the low resistance reference cell.

Figure 9:
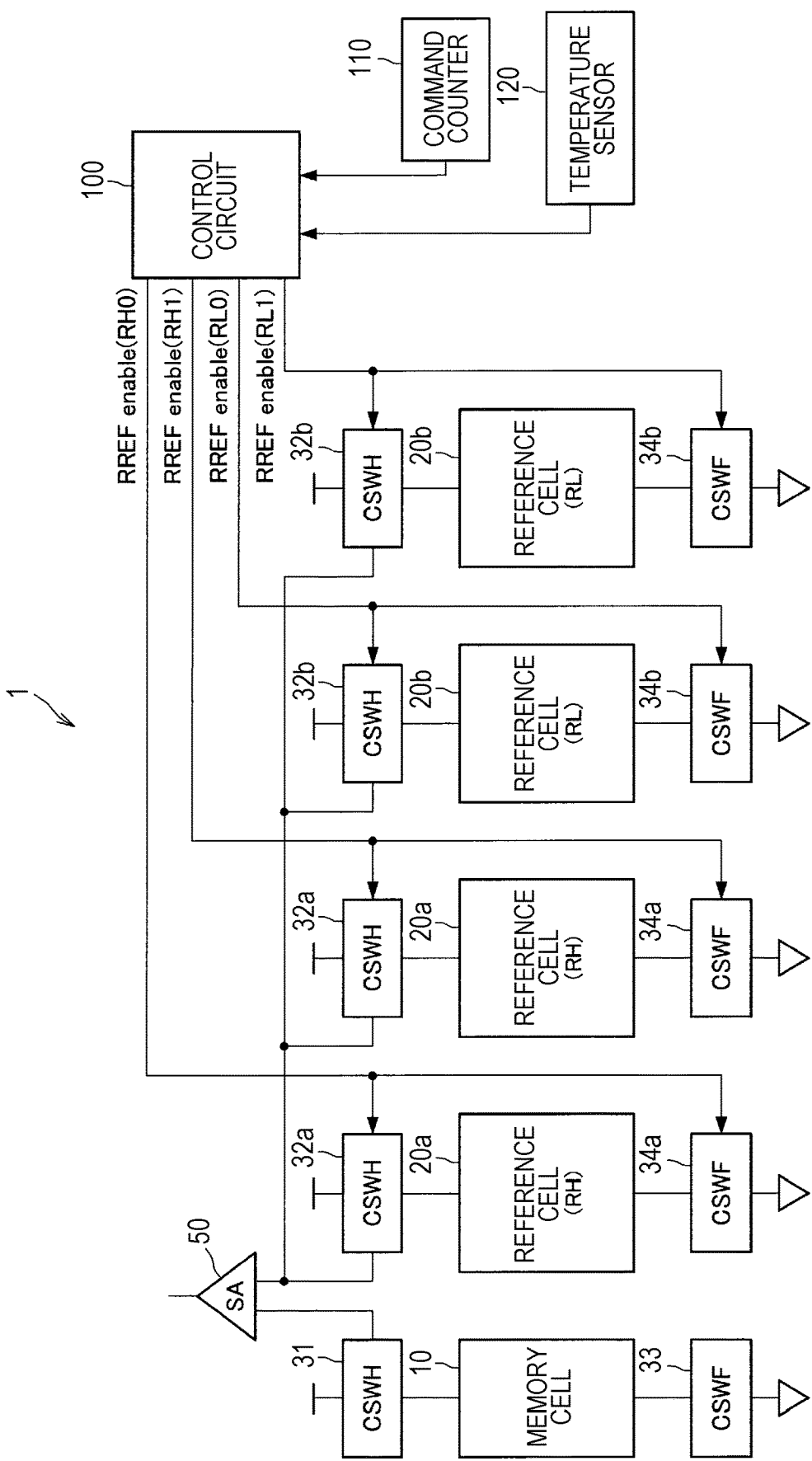
FIG. 9 is an explanatory diagram showing another example of the functional configuration of the semiconductor memory device 1 according to the same embodiment.

FIG. 9 is an explanatory diagram showing another example of a functional configuration of the semiconductor memory device 1 according to the present embodiment, and shows an example of a functional configuration of the semiconductor memory device 1 for changing the refresh operation between a high resistance reference cell and a low resistance reference cell. Furthermore, FIG. 10 is an explanatory diagram showing an example of a circuit configuration of the memory cell and the reference cell shown in FIG. 9, and shows an example in the case of generating a reference potential by a high resistance reference cell and a low resistance reference cell.

Figure 10:
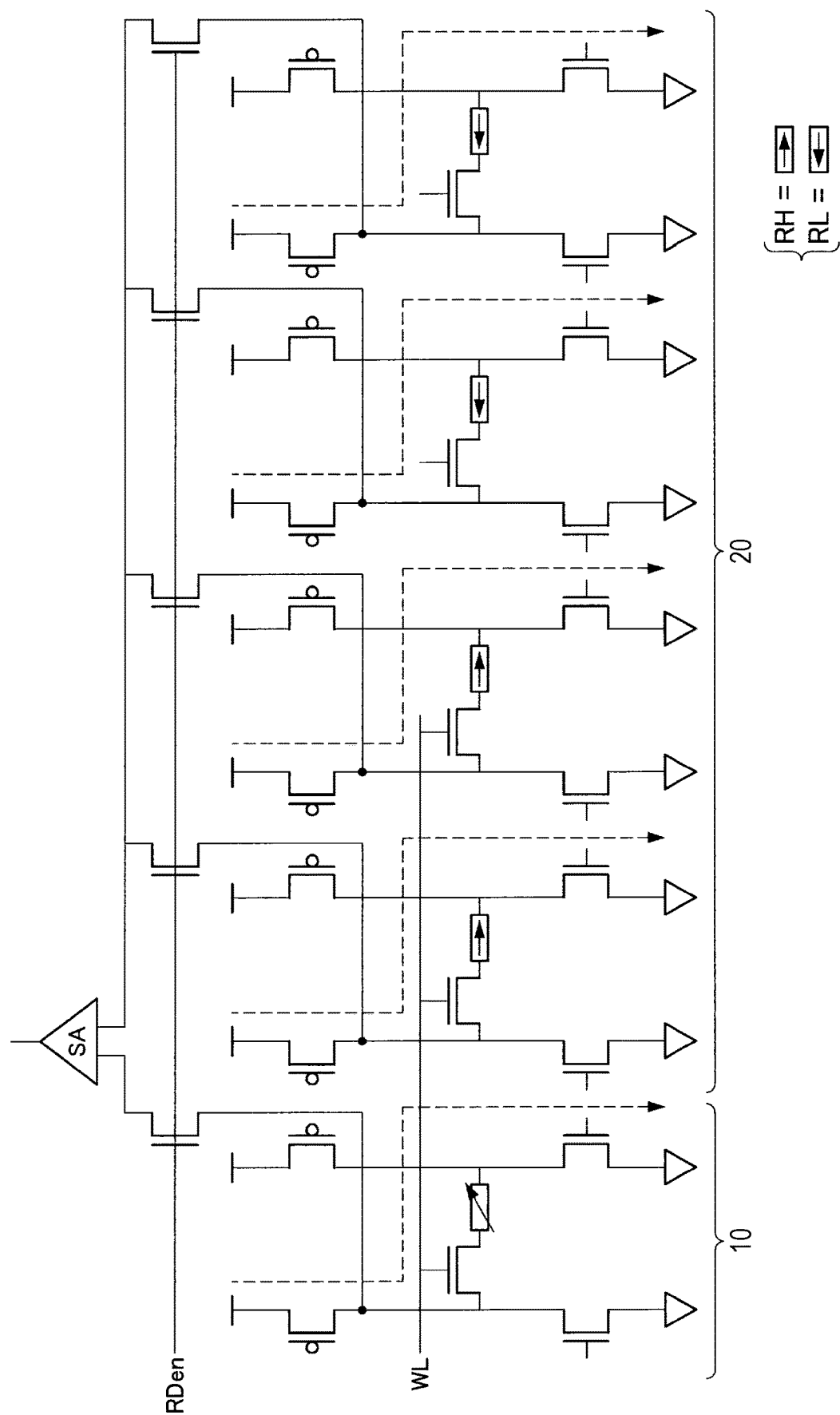
FIG. 10 is an explanatory diagram showing an example of a circuit configuration of the memory cell and the reference cell shown in FIG. 9.

FIGS. 9 and 10 show an example of the semiconductor memory device 1 in which two high resistance reference cells and two low resistance reference cells are connected in parallel as reference cells. In other words, FIGS. 9 and 10 show a configuration in which a normal memory cell is connected to one side of the sense amplifier 50, and two high resistance (RH) reference cells and two low resistance (RL) reference cells are connected in parallel as reference cells on the other side.

FIG. 11 is an explanatory table showing an example of the output of the refresh enable signal to the high resistance reference cell and the low resistance reference cell shown in FIGS. 9 and 10 by the control circuit 100. As described above, the refresh enable signal is not output to the high resistance reference cell, and the refresh enable signal is output to the low resistance reference cell in synchronization with the timing of the write operation to the normal memory cell.

Note that, in the high resistance reference cell in which the read disturb does not occur, logic inversion (retention failure) randomly occurring due to thermal fluctuation may occur with a very small probability. Accordingly, the control circuit 100 may periodically perform the refresh operation on the high resistance reference cell. In the example shown in FIG. 11, the control circuit 100 outputs the refresh enable signal also to the high resistance reference cell every time the control circuit 100 outputs the refresh enable signal 256 times to the low resistance reference cell.

FIG. 12 is an explanatory table showing an example of the output of the refresh enable signal to the high resistance reference cell and the low resistance reference cell shown in FIGS. 9 and 10 by the control circuit 100. In the example shown in FIG. 12, after the control circuit 100 outputs the refresh enable signal to the low resistance reference cell 255 times, the control circuit 100 outputs the refresh enable signal only to the high resistance reference cell at the next refresh operation timing.

FIG. 13 is an explanatory table showing an example of the output of the refresh enable signal to the high resistance reference cell and the low resistance reference cell shown in FIGS. 9 and 10 by the control circuit 100. In the example shown in FIG. 13, the control circuit 100 outputs the refresh enable signal alternately to the low resistance reference cell, and at the refresh operation timing of 256 times and 257 times, the control circuit 100 outputs the refresh enable signal alternately only to the high resistance reference cell.

Note that the refresh operation for the high resistance reference cell is operation that is mainly required in a case where the performance of the memory cell material is low, and is operation that is not necessary for the memory cell material with an ideal or nearly ideal performance. The output frequency of the refresh enable signal for the high resistance reference cell can be appropriately selected according to the performance of the memory cell material, the current value, and the scale of the control circuit 100, and the desired setting may be made in the register prepared in advance.

The control circuit 100 may consider the number of reads in the output of the refresh enable signal RREF. The probability of failure due to the read disturb increases as the number of times of read commands increases. Accordingly, the number of allowable times of read commands may be set in advance, and the control circuit 100 may perform refresh operation for the low resistance reference cell at the timing when the write command is issued after the number of times of read command issuance reaches the set value.

FIG. 14 is an explanatory table showing an example of the output of the refresh enable signal to the high resistance reference cell and the low resistance reference cell shown in FIGS. 6 and 7 by the control circuit 100. In the example shown in FIG. 14, when the number of times of read command issuance reaches three, the refresh enable signal RREF is output to the low resistance reference cell at the timing when the write command is issued.

Figure 15:
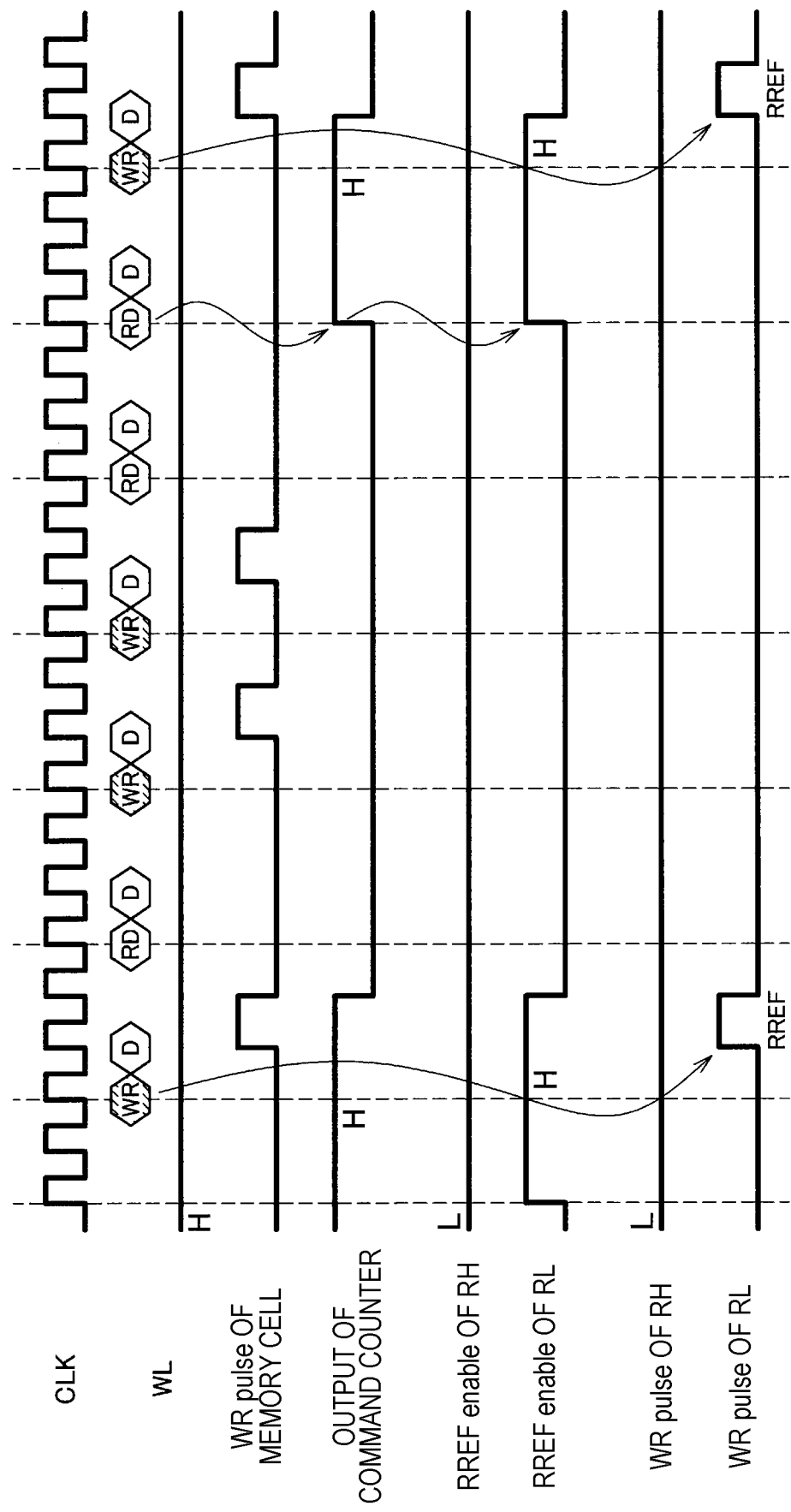
FIG. 15 is an explanatory diagram showing operation of the semiconductor memory device 1 according to the same embodiment in a timing chart.

FIG. 15 is an explanatory diagram showing the operation of the semiconductor memory device 1 by a timing chart, and is an example of operation in which, as shown in FIG. 14, when the number of times of read command issuance reaches three, the refresh enable signal RREF is output to a low resistance reference cell at the timing when a write command is issued. Thereafter, when the number of times of read command issuance reaches three, the control circuit 100 that has output the refresh enable signal RREF to the low resistance reference cell to which the write command has been issued again outputs the refresh enable signal RREF to the low resistance reference cell at the timing when a write command is issued. Note that FIG. 15 shows the following.

The control circuit 100 may consider the signal from the temperature sensor 120 at the output of the refresh enable signal RREF. For example, in a case where the temperature sensor 120 can output signals indicating two states, a low temperature state and a high temperature state, the control circuit 100 may change the interval for outputting the refresh enable signal RREF to the low resistance reference cell depending on whether it is a case where a signal is output with which the temperature sensor 120 indicates a low temperature state, or it is a case where a signal is output with which the temperature sensor 120 indicates a high temperature state. In the case of the STT-MRAM, since the probability of logic inversion increases as the temperature rises, it is desirable that the control circuit 100 frequently outputs the refresh enable signal RREF. For example, in a case where the temperature exceeds temperature set in advance, the control circuit 100 can also perform control to double the output frequency of the refresh enable signal RREF.

FIG. 16 is an explanatory table showing an example of the output of the refresh enable signal to the high resistance reference cell and the low resistance reference cell shown in FIGS. 6 and 7 by the control circuit 100. In the example shown in FIG. 16, in the low temperature state, when the number of times of write command issuance reaches 256, the refresh enable signal RREF is output to the low resistance reference cell at the timing when the write command is issued, and in the high temperature state, when the number of times of write command issuance reaches 128, the refresh enable signal RREF is output to the low resistance reference cell at the timing when the write command is issued.

Figure 17:
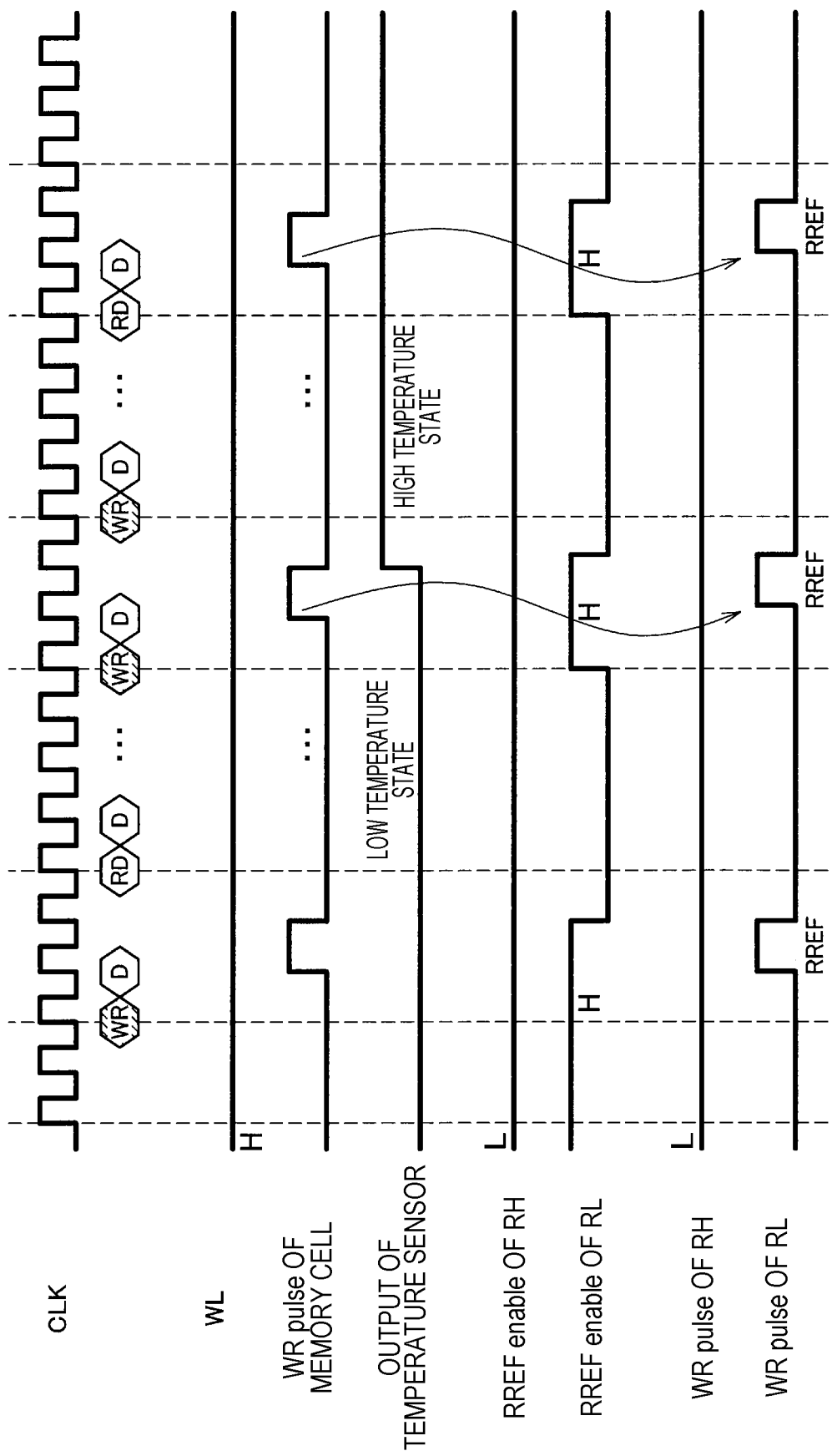
FIG. 17 is an explanatory diagram showing operation of the semiconductor memory device 1 according to the same embodiment in a timing chart.

FIG. 17 is an explanatory diagram showing the operation of the semiconductor memory device 1 by a timing chart, and, as shown in FIG. 16, is an example in the case of changing the output frequency of the refresh enable signal RREF in the low temperature state and the high temperature state. As described above, in the low temperature state, when the number of times of write command issuance reaches 256, and in the high temperature state, when the number of times of write command issuance reaches 128, the control circuit 100 outputs the refresh enable signal RREF to the low resistance reference cell at the timing when the write command is issued.

Figure 18:
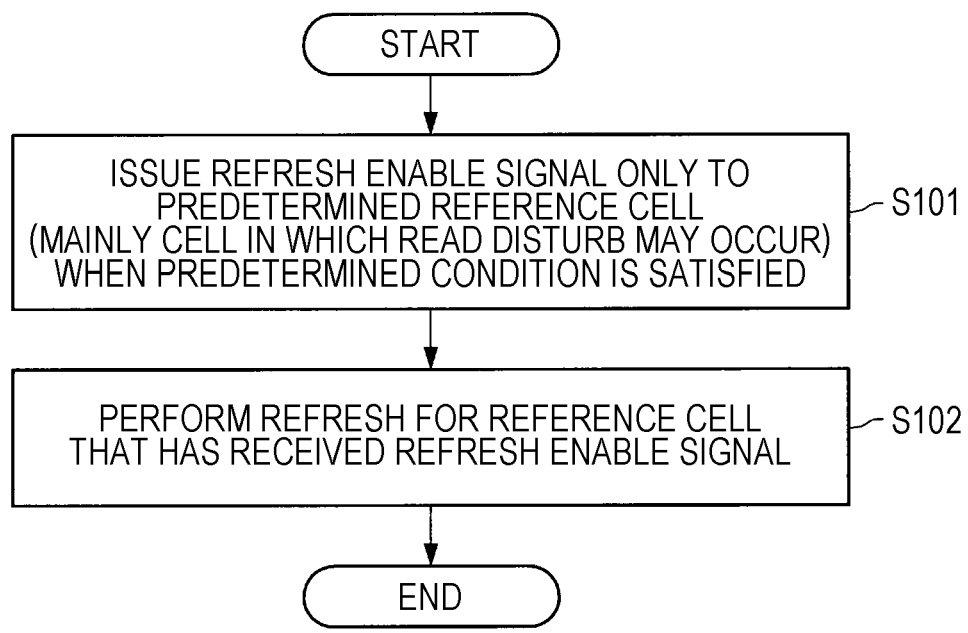
FIG. 18 is a flow chart showing an operation example of the semiconductor memory device 1 according to the same embodiment.

FIG. 18 is a flow chart showing an operation example of the semiconductor memory device 1 according to the embodiment of the present disclosure. Hereinafter, an example of operation of the semiconductor memory device 1 according to the embodiment of the present disclosure will be described with reference to FIG. 18.

When a predetermined condition is satisfied, the semiconductor memory device 1 issues a refresh enable signal from the control circuit 100 only to a predetermined reference cell, mainly a cell in which a read disturb may occur (step S101). The predetermined condition is, for example, that the number of times of write command issuance has reached a predetermined number.

When a refresh enable signal is issued from the control circuit 100 only to a predetermined reference cell, mainly a cell in which a read disturb can occur, subsequently, the semiconductor memory device 1 performs refresh on the reference cell that has received the refresh enable signal (step S102).

Figure 19:
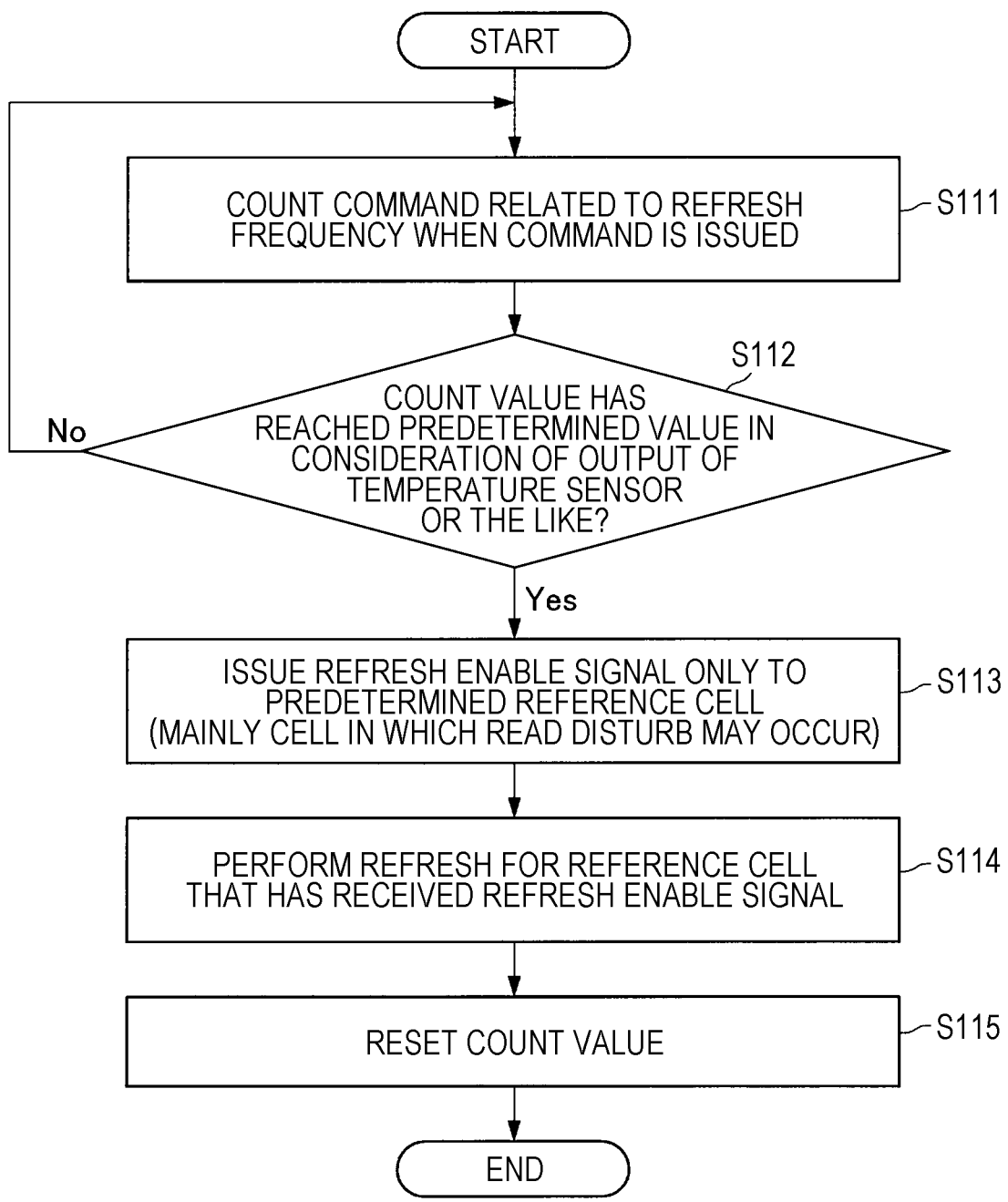
FIG. 19 is a flow chart showing an operation example of the semiconductor memory device 1 according to the same embodiment.

FIG. 19 is a flow chart showing an operation example of the semiconductor memory device 1 according to the embodiment of the present disclosure. Hereinafter, an example of operation of the semiconductor memory device 1 according to the embodiment of the present disclosure will be described with reference to FIG. 19.

When the command counter 110 issues a command (write command or read command), the semiconductor memory device 1 counts the number of times of the command related to the frequency of the refresh operation (step S111). Then, the semiconductor memory device 1 determines whether the count value counted by the command counter 110 has reached a predetermined value in consideration of the signal output from the temperature sensor 120 or the like (step S112). The control circuit 100 can make the determination in step S112.

If it is determined in step S112 that the count value has not reached the predetermined value (No in step S112), the semiconductor memory device 1 returns to the processing of step S111. On the other hand, if the count value has reached a predetermined value (Yes in step S112), the control circuit 100 issues the refresh enable signal only to a predetermined reference cell, mainly a cell in which a read disturb may occur (step S113).

When a refresh enable signal is issued from the control circuit 100 only to a cell in which a read disturb can occur, subsequently, the semiconductor memory device 1 performs refresh on the reference cell that has received the refresh enable signal (step S114). When the refresh operation on the reference cell is completed, the semiconductor memory device 1 subsequently resets the count value counted by the command counter 110 (step S115), and starts counting the number of times of the command again.

By performing a series of operation as described above, the semiconductor memory device 1 according to the embodiment of the present disclosure can achieve both reliably preventing the logic inversion of the reference cell, and suppressing the power consumption.

2. Application Example

Figure 20:
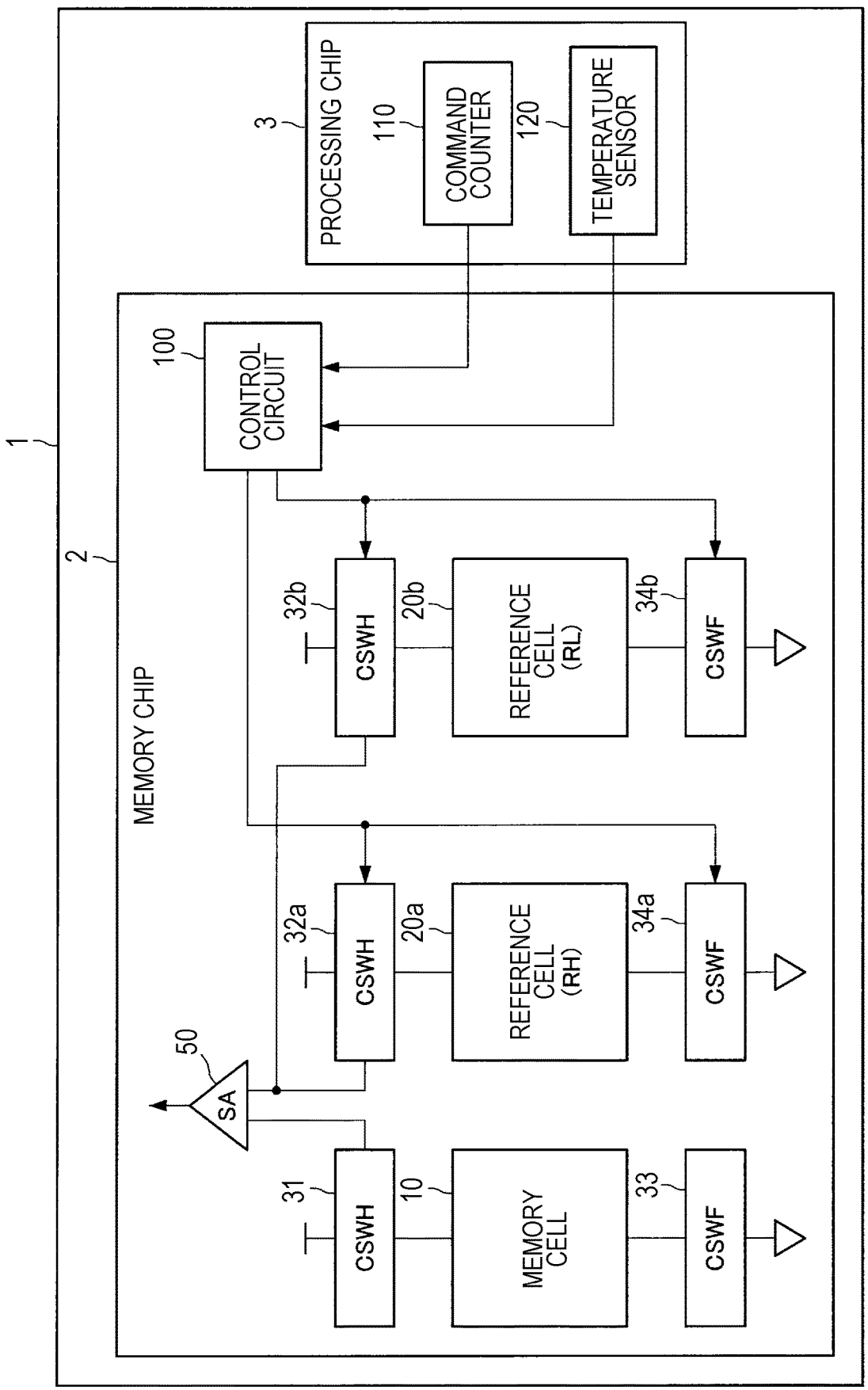
FIG. 20 is an explanatory diagram showing an example of a configuration of the semiconductor memory device 1 according to the same embodiment.

In the semiconductor memory device 1 according to the embodiment of the present disclosure, all configurations may be formed on one chip, and some configurations may be formed on another chip. FIG. 20 is an explanatory diagram showing a configuration example of the semiconductor memory device 1 according to the embodiment of the present disclosure. For example, the semiconductor memory device 1 may include a memory chip 2 and a processing chip 3. As shown in FIG. 20, the command counter 110 and the temperature sensor 120 may be formed in the processing chip 3, and other configurations may be formed in the memory chip 2. The memory chip 2 and the processing chip 3 may be then mounted on a system in package or a system on chip.

Then, the semiconductor memory device 1 according to the embodiment of the present disclosure can be mounted on various electronic devices. Examples of an electronic device on which the semiconductor memory device 1 according to the embodiment of the present disclosure can be mounted include a smartphone, a tablet terminal, a digital still camera, a digital video camera, a music player, a set top box, a computer, a television, a watch, an active speaker, headsets, a game console, a radio, a measuring instrument, an electronic tag, and a beacon.

Figure 21:
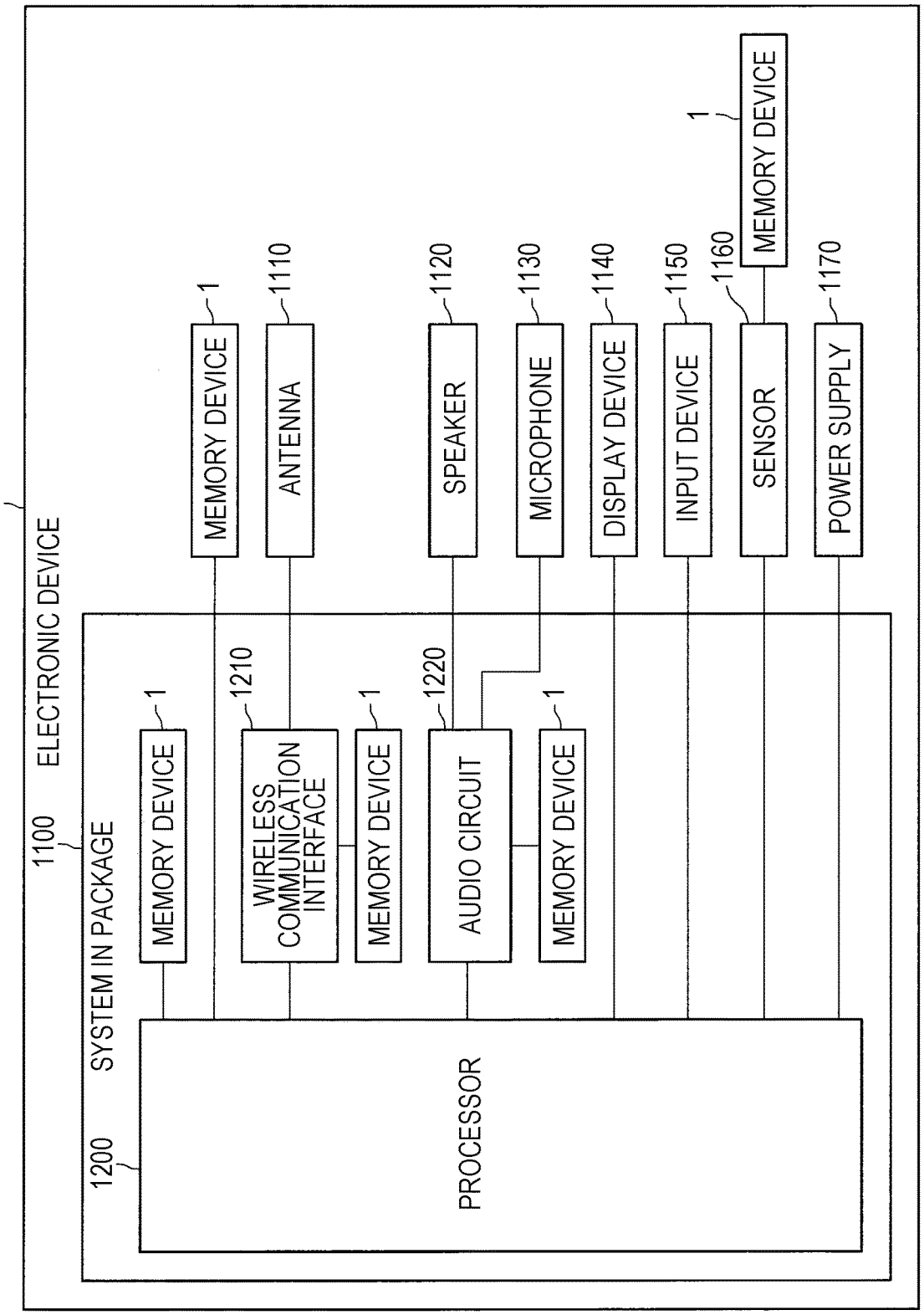
FIG. 21 is an explanatory diagram showing an example of a functional configuration of an electronic device 1000 on which the semiconductor memory device 1 according to the same embodiment can be mounted.

FIG. 21 is an explanatory diagram showing an example of a functional configuration of an electronic device 1000 on which the semiconductor memory device 1 according to the embodiment of the present disclosure can be mounted. The electronic device 1000 shown in FIG. 21 includes a system in package 1100, an antenna 1110, a speaker 1120, a microphone 1130, a display device 1140, an input device 1150, a sensor 1160, and a power supply 1170. Furthermore, the system in package 1100 includes a processor 1200, a wireless communication interface 1210, and an audio circuit 1220.

The antenna 1110 is an antenna for performing mobile communication, wireless LAN, or near field communication, and is connected to the wireless communication interface 1210. The speaker 1120 outputs sound and is connected to the audio circuit 1220. The microphone 1130 is for collecting sound around the electronic device 1000, and is connected to the audio circuit 1220.

The display device 1140 includes, for example, a liquid crystal display, an organic EL display, a light emitting diode (LED) indicator, and the like, and is connected to the processor 1200. The input device 1150 includes, for example, a keyboard, a button, a touch panel, and the like, and is connected to the processor 1200.

The sensor 1160 has functions such as an optical sensor, a position sensor, an acceleration sensor, a living body sensor, a magnetic sensor, a mechanical quantity sensor, a heat sensor, an electric sensor, or a chemical sensor. The variable resistance semiconductor memory device 1 according to the embodiment of the present disclosure may be connected to the sensor 1160. The power supply 1170 supplies power to the electronic device 1000, and is a power supply supplied from, for example, a battery or an AC adapter.

The processor 1200 is an electronic circuit for controlling the operation of the electronic device 1000, and the variable resistance semiconductor memory device 1 according to the embodiment of the present disclosure may be connected to inside or outside the system in package 1100.

The wireless communication interface 1210 has a function of mobile communication, wireless LAN, or near field communication. The variable resistance semiconductor memory device 1 according to the embodiment of the present disclosure may be connected to the wireless communication interface 1210. The audio circuit 1220 has a function of controlling the speaker 1120 and the microphone 1130, and the variable resistance semiconductor memory device 1 according to the embodiment of the present disclosure may be connected to the audio circuit 1220.

By mounting the variable resistance semiconductor memory device 1 according to the embodiment of the present disclosure, such an electronic device 1000 can improve the reliability at the time of data read while suppressing the power consumption.

3. Conclusion

As described above, according to the embodiment of the present disclosure, provided is the semiconductor memory device 1 that can achieve both reliably preventing the logic inversion of the reference cell, and suppressing the power consumption, and the control circuit 100 that controls operation of the semiconductor memory device 1.

While preferred embodiments of the present disclosure have been described above in detail with reference to the accompanying drawings, the technical scope of the present disclosure is not limited to such examples. It is obvious that various variations and modifications can be conceived within the scope of the technical idea described in the claims by a person having ordinary knowledge in the field of technology to which the present disclosure belongs, and, of course, it is understood that these variations and modifications belong to the technical scope of present disclosure.

Furthermore, the effects described in the present specification are merely illustrative or exemplary, and are not limitative. That is, the technique according to the present disclosure can exhibit other effects obvious to those skilled in the art from the description of the present specification together with the effects described above or instead of the effects described above.

Note that the following configuration is also within the technical scope of the present disclosure.

(1)

A control circuit that causes write processing to be performed individually for a first reference element set to a first resistance state in generating a reference potential used for reading data from a memory element, and a second reference element different from the first reference element, the second reference element being set to a second resistance state different from the first resistance state in generating the reference potential.

(2)

The control circuit according to (1) described above, in which a frequency of write processing on one of the first reference element and the second reference element in which a read disturb occurs is increased more than a frequency of write processing on another one of the first reference element and the second reference element in which the read disturb does not occur.

(3)

The control circuit according to (2) described above, in which write processing for the another one in which the read disturb does not occur is also performed each time a number of times of write processing for the one in which the read disturb occurs reaches a predetermined value.

(4)

The control circuit according to (2) described above, in which only write processing for the another one in which the read disturb does not occur is performed each time a number of times of write processing for the one in which the read disturb occurs reaches a predetermined value.

(5)

The control circuit according to (3) or (4) described above, in which the predetermined value is changed according to a temperature around the first reference element and the second reference element.

(6)

The control circuit according to (5) described above, in which the predetermined value is changed between a case where the temperature is equal to or higher than a predetermined temperature and a case where the temperature is lower than the predetermined temperature.

(7)

A semiconductor memory device including:
 a memory element;
 a first reference element set to a first resistance state in generating a reference potential used for reading data from a memory element;
 a second reference element different from the first reference element, the second reference element being set to a second resistance state different from the first resistance state in generating the reference potential; and
 a control circuit that performs write processing individually for the first reference element and the second reference element.

(8)

The semiconductor memory device according to (7) described above, in which the control circuit increases a frequency of write processing on one of the first reference element and the second reference element in which a read disturb occurs more than a frequency of write processing on another one of the first reference element and the second reference element in which the read disturb does not occur.

(9)

The semiconductor memory device according to (8) described above, in which the control circuit also performs write processing for the another one in which the read disturb does not occur each time a number of times of write processing for the one in which the read disturb occurs reaches a predetermined value.

(10)

The semiconductor memory device according to (8) described above, in which the control circuit only performs write processing for the another one in which the read disturb does not occur each time a number of times of write processing for the one in which the read disturb occurs reaches a predetermined value.

(11)

The semiconductor memory device according to (9) or (10) described above, in which the control circuit changes the predetermined value according to a temperature around the first reference element and the second reference element.

(12)

The semiconductor memory device according to (11) described above, in which the control circuit changes the predetermined value between a case where the temperature is equal to or higher than a predetermined temperature and a case where the temperature is lower than the predetermined temperature.

(13)

The semiconductor memory device according to any one of (7) to (12) described above, in which the memory element is a variable resistance memory element.

(14)

The semiconductor memory device according to (13) described above, in which the memory element is a variable magnetoresistance memory element.

(15)

An information processing device including at least one semiconductor memory device according to claim 1.

(16)

A control method for performing write processing individually for a first reference element set to a first resistance state in generating a reference potential used for reading data from a memory element, and a second reference element different from the first reference element, the second reference element being set to a second resistance state different from the first resistance state in generating the reference potential.

REFERENCE SIGNS LIST

1 Semiconductor memory device
100 Control circuit

The invention claimed is:

1. A control circuit that causes write processing to be performed individually for a first reference element set to a first resistance state in generating a reference potential used for reading data from a memory element, and a second reference element different from the first reference element, the second reference element being set to a second resistance state different from the first resistance state in generating the reference potential, wherein a frequency of write processing on one of the first reference element and the second reference element in which a read disturb occurs is increased more than a frequency of write processing on another one of the first reference element and the second reference element in which the read disturb does not occur.

2. The control circuit according to claim 1, wherein write processing for the another one in which the read disturb does not occur is also performed each time a number of times of write processing for the one in which the read disturb occurs reaches a predetermined value.

3. The control circuit according to claim 2, wherein the predetermined value is changed according to a temperature around the first reference element and the second reference element.

4. The control circuit according to claim 3, wherein the predetermined value is changed between a case where the temperature is equal to or higher than a predetermined temperature and a case where the temperature is lower than the predetermined temperature.

5. The control circuit according to claim 1, wherein only write processing for the another one in which the read disturb does not occur is performed each time a number of times of write processing for the one in which the read disturb occurs reaches a predetermined value.

6. A semiconductor memory device comprising:
a memory element;
a first reference element set to a first resistance state in generating a reference potential used for reading data from the memory element;
a second reference element different from the first reference element, the second reference element being set to a second resistance state different from the first resistance state in generating the reference potential; and
a control circuit that performs write processing individually for the first reference element and the second reference element,
wherein the control circuit increases a frequency of write processing on one of the first reference element and the second reference element in which a read disturb occurs more than a frequency of write processing on another one of the first reference element and the second reference element in which the read disturb does not occur.

7. The semiconductor memory device according to claim 6, wherein the control circuit also performs write processing for the another one in which the read disturb does not occur each time a number of times of write processing for the one in which the read disturb occurs reaches a predetermined value.

8. The semiconductor memory device according to claim 7, wherein the control circuit changes the predetermined value according to a temperature around the first reference element and the second reference element.

9. The semiconductor memory device according to claim 8, wherein the control circuit changes the predetermined value between a case where the temperature is equal to or higher than a predetermined temperature and a case where the temperature is lower than the predetermined temperature.

10. The semiconductor memory device according to claim 6, wherein the control circuit only performs write processing for the another one in which the read disturb does not occur each time a number of times of write processing for the one in which the read disturb occurs reaches a predetermined value.

11. The semiconductor memory device according to claim 6, wherein the memory element is a variable resistance memory element.

12. An information processing device comprising at least one semiconductor memory device according to claim 6.

13. A control method for performing, by a processor, write processing individually for a first reference element set to a first resistance state in generating a reference potential used for reading data from a memory element, and a second reference element different from the first reference element, the second reference element being set to a second resistance state different from the first resistance state in generating the reference potential, wherein a frequency of write processing on one of the first reference element and the second reference element in which a read disturb occurs is increased more than a frequency of write processing on another one of the first reference element and the second reference element in which the read disturb does not occur.

* * * * *